United States Patent [19]

Kawai

[11] Patent Number: 5,204,762
[45] Date of Patent: Apr. 20, 1993

[54] IMAGE READING DEVICE

[75] Inventor: Tatsundo Kawai, Hiratsuka, Japan

[73] Assignee: Canon Kabushiki Kaisha, Tokyo, Japan

[21] Appl. No.: 925,426

[22] Filed: Aug. 10, 1992

Related U.S. Application Data

[63] Continuation of Ser. No. 727,359, Jul. 9, 1991, abandoned, which is a continuation of Ser. No. 563,858, Aug. 7, 1990, abandoned, which is a continuation of Ser. No. 262,726, Oct. 26, 1988, abandoned.

[30] Foreign Application Priority Data

Oct. 30, 1987 [JP] Japan .................. 62-273133

[51] Int. Cl.$^5$ .................. A04M 3/14
[52] U.S. Cl. .................. 358/474; 358/213.11; 358/482; 437/5
[58] Field of Search .......... 358/213.11, 472, 482, 358/483, 228, 213.19, 213.13, 225, 473, 461, 447; 359/601

[56] References Cited

U.S. PATENT DOCUMENTS 4,332,075 6/1982 Ota .................. 437/59
4,589,026 5/1986 Ozawa .................. 358/213.11
4,663,535 5/1987 Nakai .................. 358/75
4,739,414 4/1988 Pryor .................. 358/285
4,755,859 7/1988 Suda .................. 357/22
4,758,734 7/1988 Uchida .................. 250/578
4,766,085 8/1988 Nishigaki .................. 437/51
4,939,592 7/1990 Saika et al. .................. 358/482
5,014,174 5/1991 Won et al. .................. 359/601

FOREIGN PATENT DOCUMENTS 0140772 11/1981 Japan .................. 358/213.19
0051376 3/1985 Japan .................. 358/213.19
0062279 4/1985 Japan .................. 358/213.13

Primary Examiner—Edward L. Coles, Sr.
Assistant Examiner—Jerome Grant, II
Attorney, Agent, or Firm—Fitzpatrick, Cella, Harper & Scinto

[57] ABSTRACT

An image reading device having a translucent substrate and plural photoelectric converting elements arranged thereon, comprises opaque areas formed in the translucent areas of the translucent substrate in the vicinity of the photoelectric converting elements for the purpose of transmitting a uniform amount of light for each photoelectric converting element.

42 Claims, 6 Drawing Sheets

IMAGE READING DEVICE

This application is a continuation, of application Ser. No. 07/727,359 filed Jul. 9, 1991, which is a continuation of Ser. No. 07/563,858, filed Aug. 7, 1990, which is a continuation of Ser. No. 07/262,726, filed Oct. 26, 1988, all now abandoned.

BACKGROUND OF THE INVENTION

1. Field of the Invention

The present invention relates to an image reading device, and more particularly, to an image reading device having a one-dimensional line sensor for reading the image information of an original maintained in contact with said line sensor and moved with respect thereto, and adapted for use in a facsimile apparatus, an image reader or the like.

2. Related Background Art

In the field of so-called contact-type image reading devices, there has been principally employed a structure incorporating a rod lens array for projecting the image of the original onto a photosensor or photosensors having phtoelectric converting elements.

On the other hand, there has recently been developed image reading devices which do not use the rod lens array for the purpose of cost reduction and compactization, but have a thin transparent protective layer formed on the photosensor, for direct contact with the original during image reading.

FIG. 1 illustrates an example of the schematic construction of such an image reading device, and shows an original pressing roller 1; an original 2; a translucent substrate 3 having unrepresented photoelectric converting elements on the surface thereof; a translucent protective layer 4 adhered onto the surface of the substrate 3; a structure 5 for supporting the substrate 3; and a light source 6 for illuminating the original.

In such an image reading device, the light from said light source 6 enters from the bottom face of the translucent substrate 3, and reaches the original 2, passing through the vicinity of the photoelectric converting elements formed on the surface of the substrate 3, and the light diffused on the surface of the original 2 enters the photoelectric converting elements through the translucent protective layer 4.

FIGS. 2 and 3 illustrate an example of the pattern of the photoelectric converting elements formed on the surface of the translucent substrate 3, wherein FIG. 2 shows an end portion of an array of the photoelectric converting elements while FIG. 3 shows a central portion of said array.

Referring to FIGS. 2 and 3, there are shown photoelectric converting elements 7; capacitors 8; thin film transistors (TFT) 9; TFT driving signal lines 10; and reading signal lines 11, wherein the components 7 to 11 are opaque to light, while the remaining substrate areas are translucent.

If the illuminating light source 6 is sufficiently long in the direction of the array of the photoelectric converting elements and has uniform light intensity thereby giving uniform light intensity on the bottom face of the translucent substrate 3, uniform outputs can be expected from the photoelectric converting elements as shown in the FIG. 4, in case of reading an original of uniform density. However, an unevenness in the output, for example, as shown in FIG. 5 occurs in most of the image reading devices of a pattern as shown in FIGS. 2 and 3. Such unevenness results from the variation in the amount of light reaching the original 2 through the translucent areas, and from the variation in the amount and form of the light beam entering the photoelectric converting elements 7 after being diffused on the original, since the translucent and opaque patterns in the vicinity of the photoelectric converting elements 7 slightly vary from location to location. Due to the occurrence of such unevenness, the S/N ratio of the image signal is deteriorated, thereby the image quality is poor.

SUMMARY OF THE INVENTION

In consideration of the foregoing, an object of the present invention is to solve the above problem and to provide an image reading device capable of reducing the location-dependent variation in the patterns of the opaque and translucent patterns in the vicinity of the photoelectric converting elements, thereby suppressing the unevenness of the output.

The above-mentioned object can be achieved, according to the present invention, by an image reading device having a translucent substrate and plural photoelectric converting elements arranged on said translucent substrate, comprising an opaque area in the translucent portion in the vicinity of the photoelectric converting element in order to transmit a uniform light quantity for each photoelectric converting element. The presence of such opaque areas in the translucent portions in the vicinity of the photoelectric converting elements, for the purpose of transmitting uniform light quantity for each element, allows a reduction in the unevenness of the output from the end portions of the array of the photoelectric converting elements.

DETAILED DESCRIPTION OF THE PREFERRED EMBODIMENT

An image reading device of the present invention has a construction wherein a quantity of illumination light incident on an original surface through a substrate is made substantially uniform corresponding to respective photoelectric conversion elements so that a quantity of reflected light incident on respective photoelectric conversion elements from an original surface of uniform reflectivity would be substantially uniform, thereby the above problem is solved.

An image reading apparatus according to the present invention includes a transparent substrate, and plurality of photoelectric conversion elements arranged on the transparent substrate. A light shielding section for transmiting a light of uniform quantity is provided for the photoelectric conversion elements at light transmitting positions of the transparent substrate in the vicinity of the photoelectric conversion elements.

According to the present invention, unevenness occurring in particular in the vicinity of an end portion of the photoelectric conversion element column is reduced by providing a light shielding section at a transparent portion in the vicinity the photoelectric conversion elements in order to transmit light uniformly through the substrate.

A preferred embodiment of the present invention will be described with reference to the accompanying drawings as follow.

Figure 6:
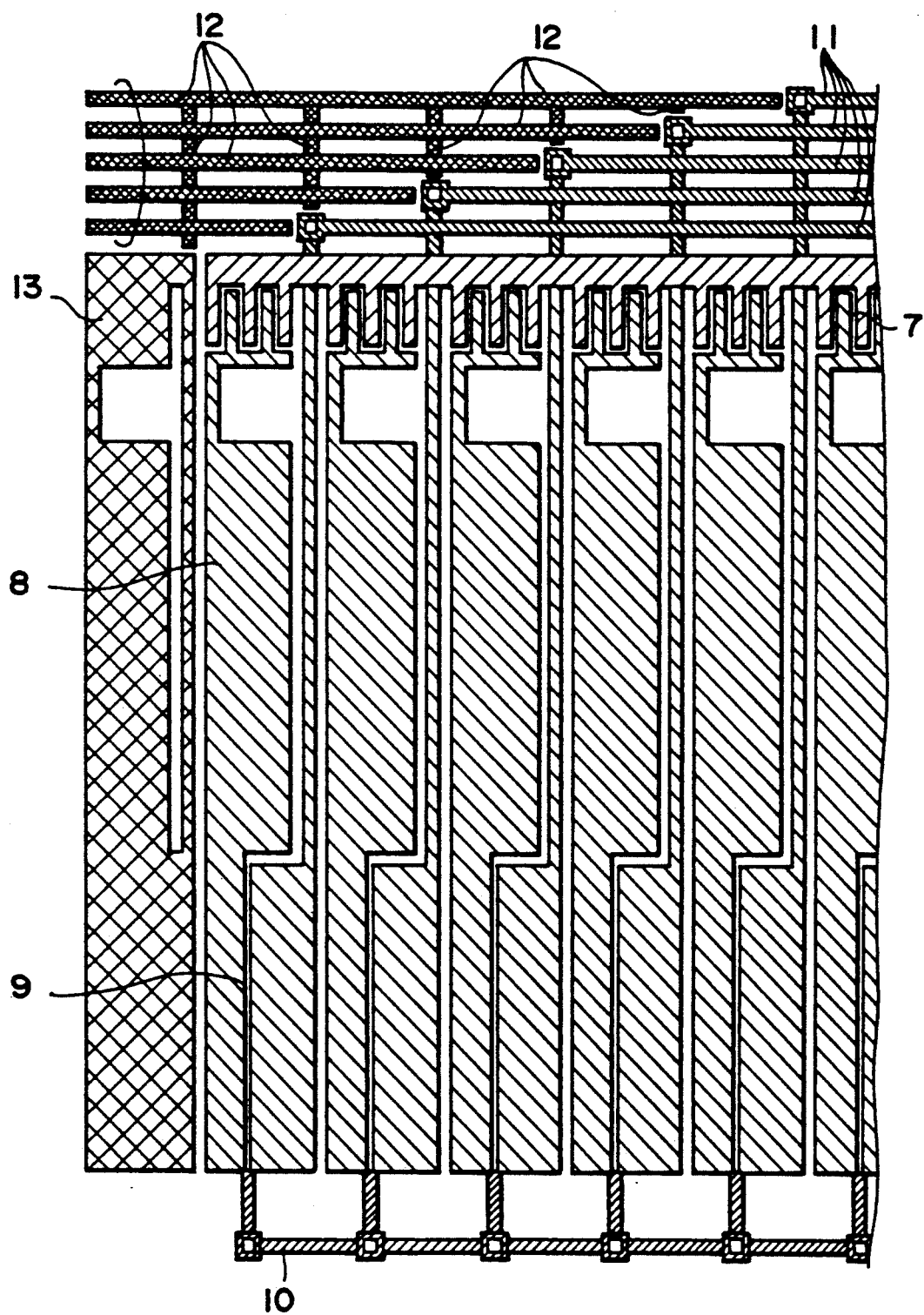
FIGS. 6 and 7 are views respectively showing the patterns at an end portion and a central portion of the transparent substrate according to a preferred embodiment of the present invention.
Figure 7:
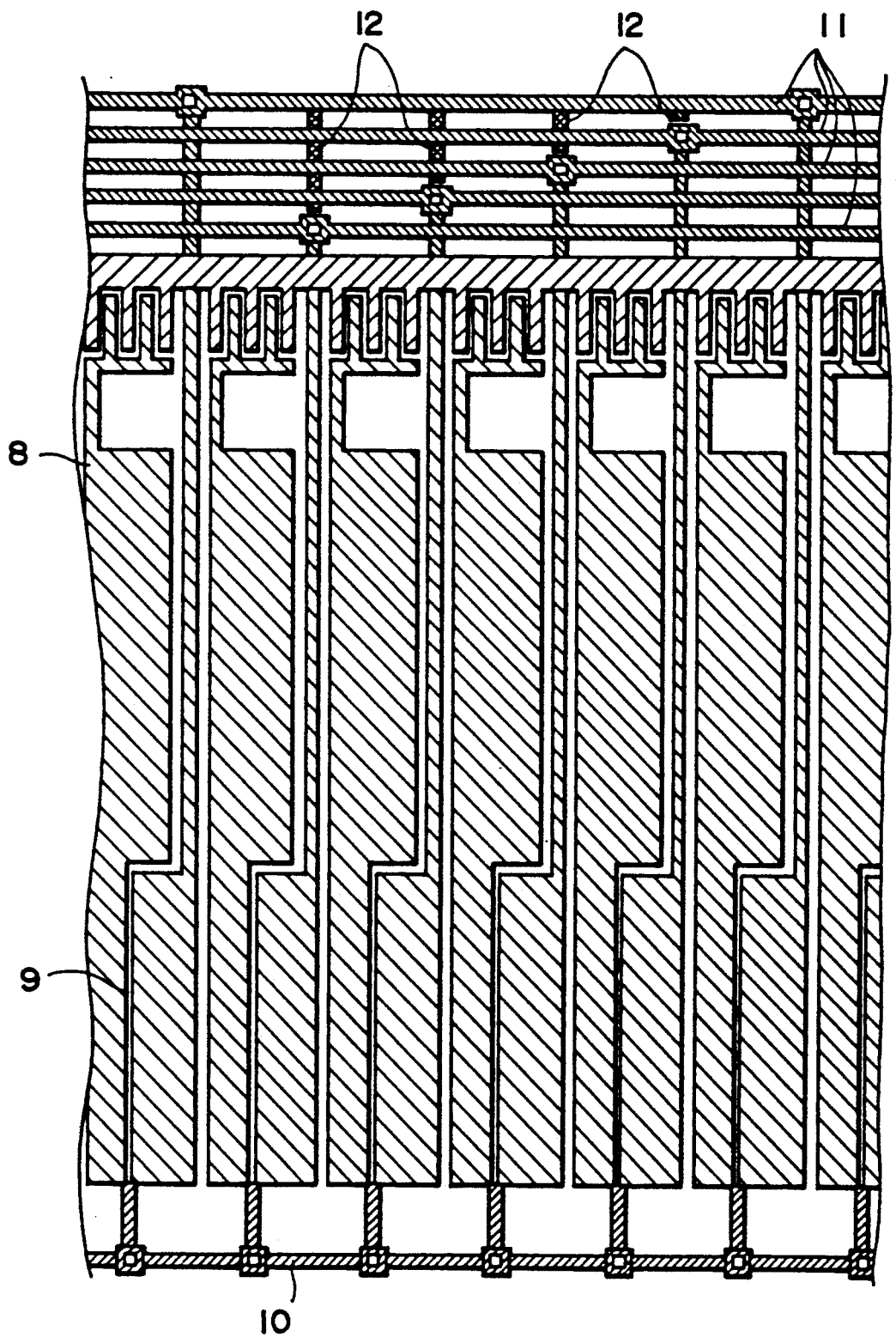

FIGS. 6 and 7 are schematic views illustrating a pattern formed on a transparent substrate of an image reading device according to the present invention. FIG. 6 shows an edge portion on the transparent substrate. FIG. 7 schematically shows a pattern configuration at a center of the transparent substrate.

Figure 1:
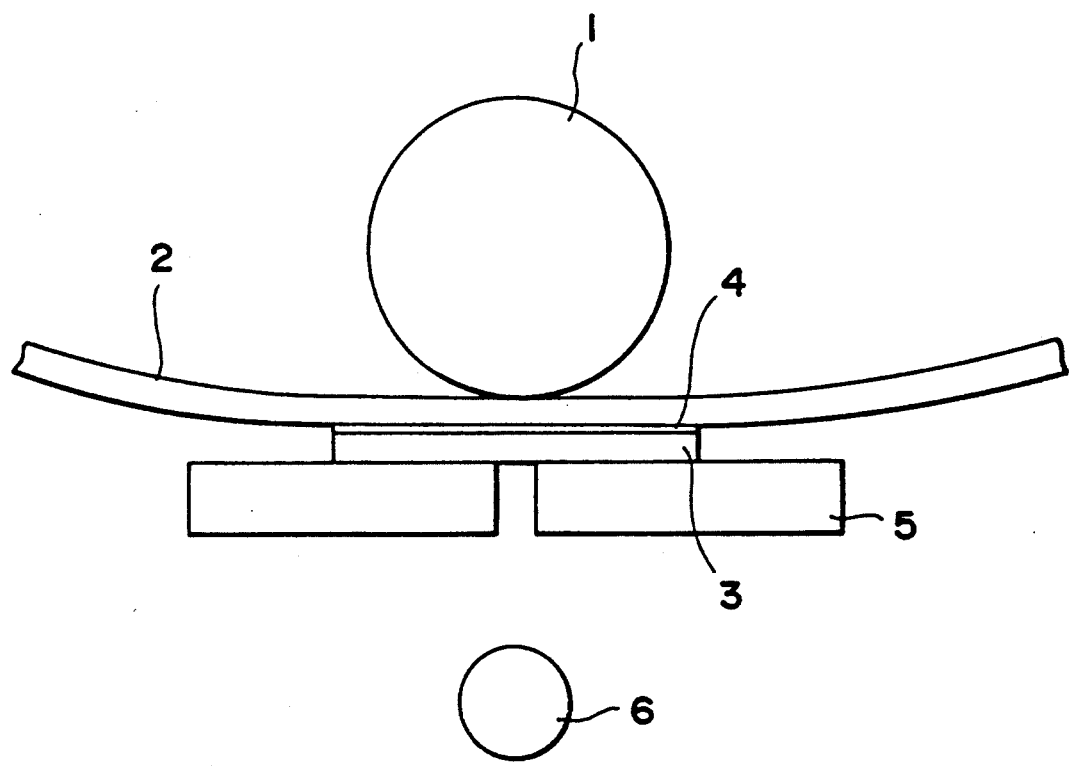
FIG. 1 is a view of a schematic construction illustrating an example of a conventional image reading device not utilizing a rod lens array.
Figure 2:
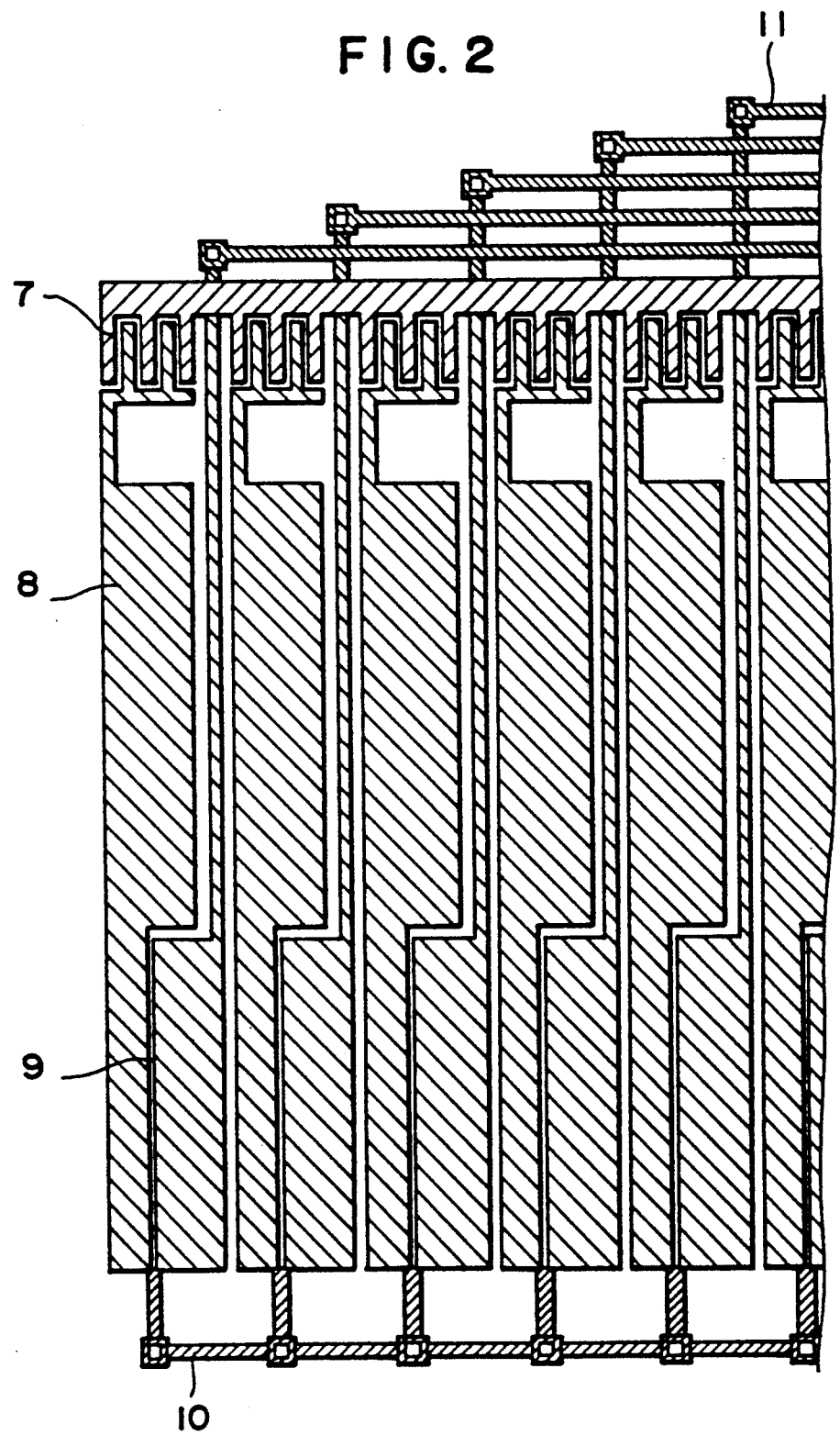
FIGS. 2 and 3 are views of a schematic construction of an example of the pattern in the conventional image reading device shown in FIG. 1, respectively at an end portion and a central portion on the translucent substrate.
Figure 3:
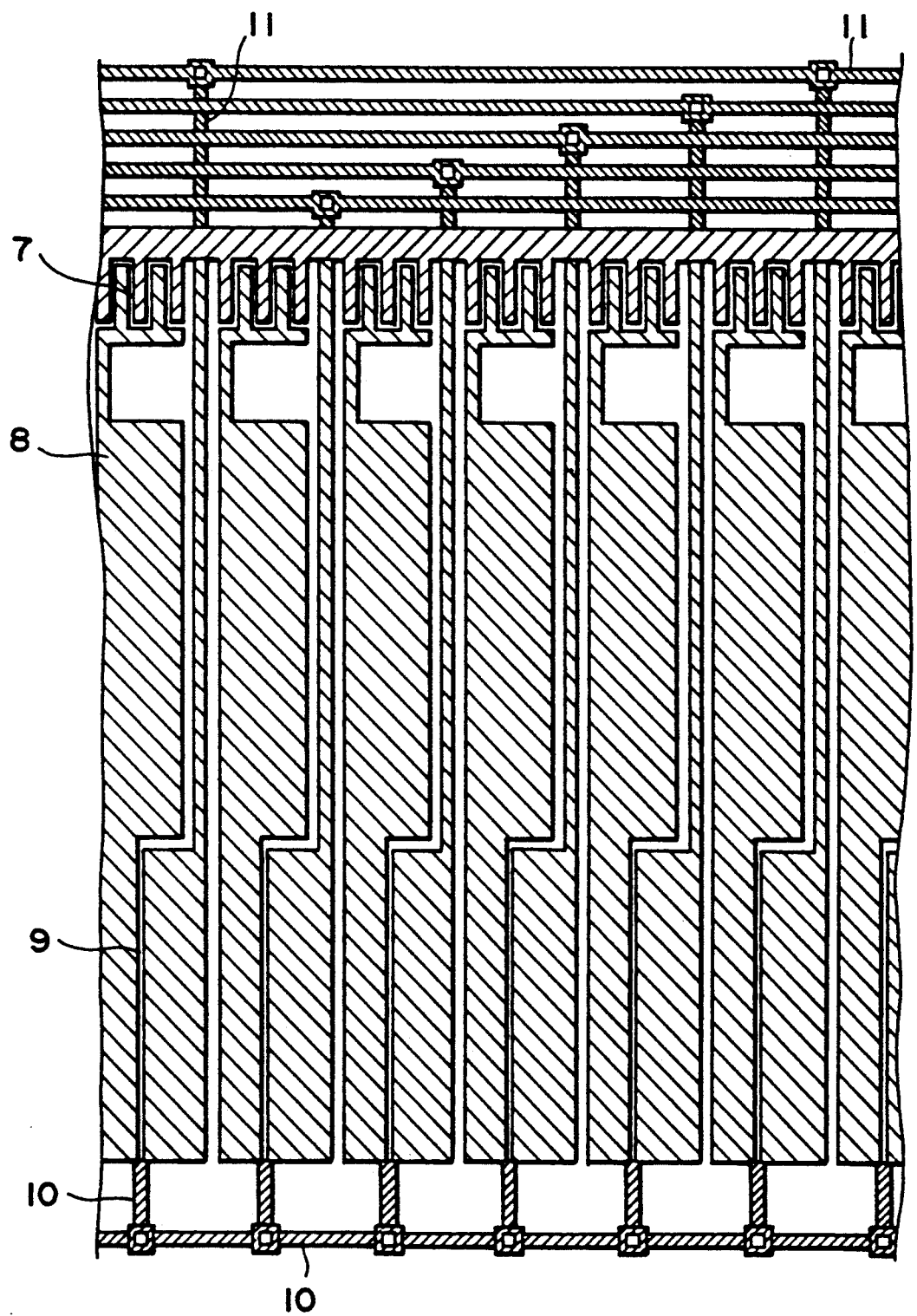

Since a basic circuit wiring pattern and a basic configuration of the photoelectric conversion element of the device as shown in FIGS. 6 and 7 are identical with those as shown in FIGS. 2 and 3, they are not described in detail.

As shown in FIGS. 6 and 7, according to the present embodiment, on the surface of the translucent substrate 3, there are formed opaque dummy patterns 12 resembling in shape the reading signal lines 11, and opaque dummy patterns 13 resembling, in shape, the photoelectric converting elements 7, capacitors 8, TFT's 9 and a part of the reading signal lines. As shown in FIG. 6, the opaque dummy patterns are provided at a side of an end portion of a column of said photoelectric converting elements.

More specifically, in the present embodiment, dummy patterns functioning as opaque layers are formed in such a manner that the opaque areas (or translucent areas) corresponding to the photoelectric converting elements become substantially identical.

As a material for forming the opaque areas, any material can be used, if the material can substantially shield light, can be patterned, and does not cause adverse effects for the image reading device.

The light shield shields optical radiation (an electromagnetic wave) from an illumination light source. However, considering a spectral sensitivity distribution, if the opaque area transmits some light, the light will be a wave length which can not be sensed by the photoelectric conversion element, or a wave length which is hardly sensed and does not substantially effect the signal output. Thus, the opaque area will have a substantial light shielding property.

As a material for such a light shield, for example, a metal as an inorganic material, and a resin as an organic material can be used. More concretely, as the metallic material, Al, Cr, or a material selected from matellic oxides and nitrides can be used. As the resin material, a material including a dye or a pigment is desirable. Typically, a polyamide resin, a polyimide resin, silicone resin, epoxy resin, or the like can be used. In particular, when a photosensitive resin is used as the material, a fine pattern can be preferably formed by a photolithography process.

Moreover, when the opaque area is made of a material identical with one constituting the electrode wiring and the photoelectric conversion element, for example, Al, the area can be preferably patterned simultaneous with the formation of the electrode wiring and the photoelectric conversion element.

Further, when a sectional structure (laminate structure) of the opaque area is identical with that of the electrode wiring and the photoelectric conversion element, the area can be formed simultaneously with the formation of the electrode wiring and the photoelectric conversion element in the same process using the same material. Thus, it is more advantageous.

In the present embodiment opaque dummy patterns are formed resembling a part of the reading signal lines, but such a form is not essential in terms of realizing uniform illuminating conditions for the photoelectric converting elements.

That is, any dummy patterns may be used if are disposed so that the illumination on both sides of the photoelectric conversion elements is the same as the illumination on one side of the photoelectric conversion element.

Also said opaque dummy patterns may be formed to cover the reading signal lines, or may be provided only on necessary portions of the substrate.

When the opaque area is formed so as to constitute a pattern as shown in FIGS. 6 and 7, and the output distribution is measured, the patterns of the opaque areas and translucent areas in the vicinity of the photoelectric converting elements are substantially the same in any portion of the array of said elements, so that unevenness in the outputs of the photoelectric conversion elements can be substantially prevented.

As explained in the foregoing, the present embodiment provides substantially uniform patterns of opaque and translucent areas in the vicinity of the photoelectric converting elements in any portion of the array formed on the translucent substrate, by means of dummy patterns, thereby preventing unevenness in the output and suppressing the deterioration in the image quality.

Moreover, since a correction or compensation circuit is unnecessary, a circuit structure of the device can be made simplified. Thus, the cost is reduced.

I claim:

1. An image reading device having a light-transmitting substrate and plural photoelectric converting elements arranged thereon, comprising:
    dummy pattern areas formed in light-transmitting areas of said substrate in the vicinity of said photoelectric converting elements for transmitting a uniform amount of light through said substrate, said dummy pattern areas being formed on at least one of (1) a side portion, and (2) an end portion of said photoelectric elements.

2. An image reading device according to claim 1, wherein said dummy pattern areas have a configuration substantially similar to that of electrodes constituting said photoelectric conversion elements.

3. An image reading device according to claim 1, wherein said image reading device further comprises capacitors and thin film transistors coupled to said photoelectric conversion elements.

4. An image reading device according to claim 3, wherein said dummy pattern areas are formed into a configuration resembling said photoelectric converting elements, the capacitors and the thin film transistors.

5. An image reading device according to claim 1, wherein said dummy pattern areas have a form matching the form of signal lines and electrodes of said photoelectric converting elements.

6. An image reading device according to claim 4, wherein said dummy pattern areas have a configuration substantially similar to said photoelectric converting elements, said capacitors, and signal lines relating to said thin film transistors.

7. An image reading device according to claim 5, wherein said signal lines comprise matrix wiring relating to said photoelectric converting element.

8. An image reading device according to claim 1, wherein said dummy pattern areas have a layer construction identical with that of said photoelectric converting elements.

9. An image reading device according to claim 5, wherein said dummy pattern areas have a layer construction identical with that of said photoelectric converting elements and/or said signal lines.

10. An image reading device according to claim 1, wherein said dummy pattern areas comprise an inorganic material.

11. An image reading device according to claim 10, wherein said inorganic material is a metallic material.

12. An image reading device according to claim 11, wherein said metallic material is one selected from Al and Cr.

13. An image reading device according to claim 1, wherein said dummy pattern areas comprise an organic material.

14. An image reading device according to claim 13, wherein said organic material is at least one selected from polyamide resin, polyimide resin, silicone resin, and epoxy resin.

15. An image reading device according to claim 14, wherein said organic material contains a dye and/or a pigment.

16. An image reading device according to claim 1, wherein said dummy pattern areas are made of a photosensitive resin.

17. An image reading device having a light-transmitting substrate, a plurality of photoelectric conversion elements provided on said substrate, and a window for transmitting light through the substrate, comprising:
a dummy pattern area disposed at an end of a column of said photoelectric conversion elements, for transmitting a uniform amount of light through said substrate, said dummy pattern area having a configuration which is similar to at least one of said photoelectric conversion elements.

18. An image reading device according to claim 17, wherein said imaging reading device further comprises capacitors and thin film transistors coupled to said photoelectric conversion elements.

19. An image reading device according to claim 17, wherein said dummy pattern area is formed in a configuration resembling said photoelectric converting elements, the capacitors, and the thin film transistors.

20. An image reading device according to claim 19, wherein said dummy pattern area has a configuration substantially similar to said photoelectric converting elements, said capacitors, and signal lines relating to said thin film transistors.

21. An image reading device according to claim 17, wherein said dummy pattern area has a layer construction identical with that of said photoelectric converting elements.

22. An image reading device according to claim 17, wherein said dummy pattern area has a layer construction identical with that of said photoelectric converting elements and/or signal lines coupled to said photoelectric converting elements.

23. An image reading device according to claim 17, wherein said dummy pattern area comprises an inorganic material.

24. An image reading device according to claim 23, wherein said inorganic material comprises a metallic material.

25. An image reading device according to claim 24, wherein said metallic material is one selected from a group consisting of Al and Cr.

26. An image reading device according to claim 17, wherein said dummy pattern area comprises an organic material.

27. An image reading device according to claim 26, wherein said organic material is at least one selected from polyamide resin, polyimide resin, silicon resin, and epoxy resin.

28. An image reading device according to claim 27, wherein said organic material contains a dye and/or a pigment.

29. An image reading device having a light-transmitting substrate, plural photoelectric converting elements arranged thereon, and a window for transmitting light through the substrate, comprising:
dummy pattern areas formed on an end of a column of said photoelectric converting elements, wherein said dummy pattern area has a configuration similar to at least one of said photoelectric converting elements.

30. A device according to claim 29, further comprising a capacitor and TFT coupled to the photoelectric converting elements.

31. A device according to claim 29, further comprising a capacitor and TFT coupled to the photoelectric converting elements, wherein said dummy pattern area has a configuration similar to said one photoelectric converting element, said capacitor, and said TFT.

32. A device according to claim 31, wherein said dummy pattern area has a configuration substantially identical to the one photoelectric converting element, said capacitor, and a signal line relating to said TFT.

33. A device according to claim 29, wherein said dummy pattern area has a layer configuration identical to a layer configuration of said one photoelectric converting element.

34. A device according to claim 29, wherein said dummy pattern area has a layer configuration identical with a layer configuration of said one photoelectric converting element and/or a signal line coupled with said one photoelectric converting element.

35. A device according to claim 29, wherein said dummy pattern area comprises an inorganic material.

36. A device according to claim 35, wherein said inorganic material comprises a metal material.

37. A device according to claim 36, wherein said metal material is selected from a group consisting of aluminum and copper.

38. A device according to claim 29, wherein said dummy pattern comprises an organic material.

39. A device according to claim 38, wherein said organic material is selected from a group consisting of polyamide resin, polyimide resin, silicone resin, and epoxy resin.

40. A device according to claim 39, wherein said organic resin material includes dye and/or pigment.

41. A device according to claim 29, further comprising a transparent protective layer.

42. A device according to claim 41, wherein said protective layer is disposed so as to contact an original to be read.

* * * * *

UNITED STATES PATENT AND TRADEMARK OFFICE
CERTIFICATE OF CORRECTION

PATENT NO. : 5,204,762
DATED : April 20, 1993
INVENTOR(S) : TATSUNDO KAWAI

It is certified that error appears in the above-indentified patent and that said Letters Patent is hereby corrected as shown below:

COLUMN 1

Figure 4:
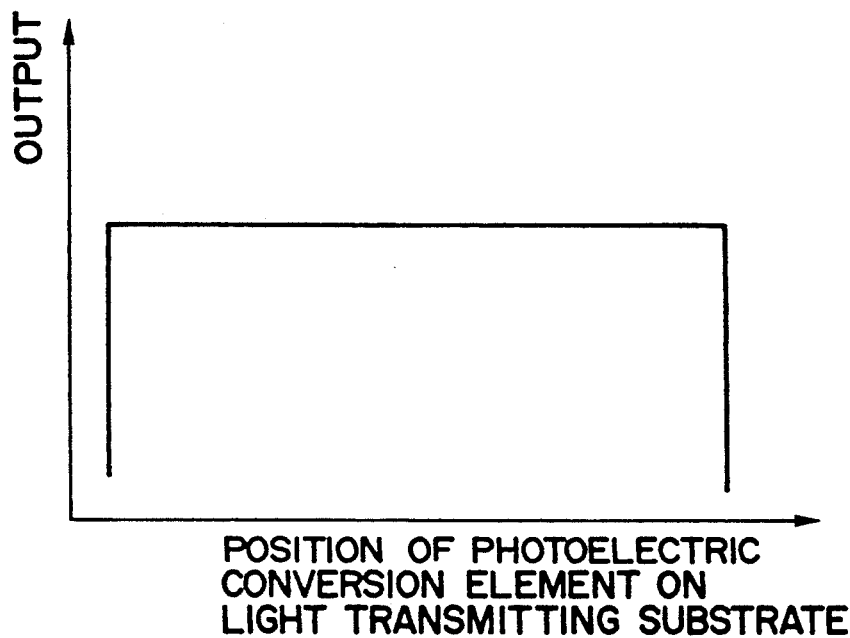
FIG. 4 is a chart showing an ideal output distribution from the photoelectric converting elements.
Figure 5:
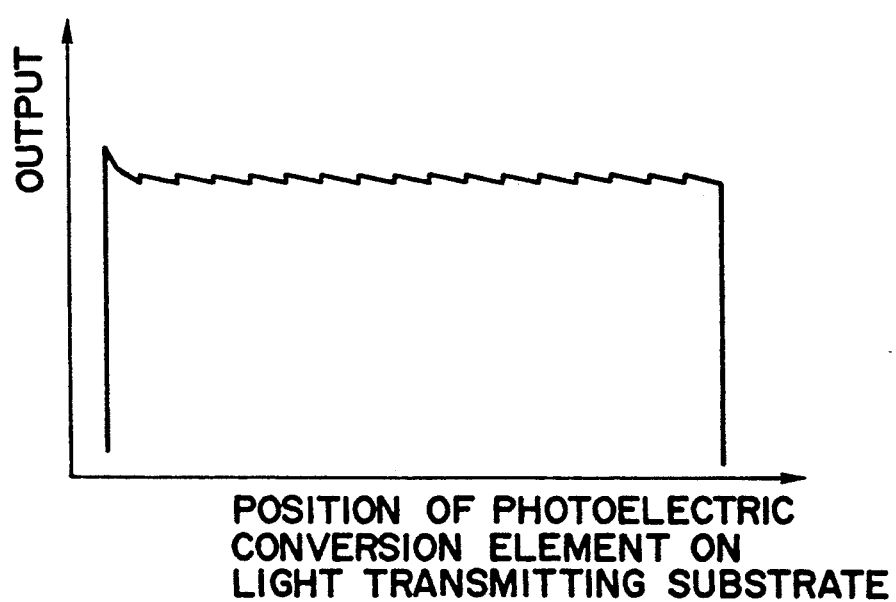
FIG. 5 is a chart showing an example of an actual output distribution obtained from conventional photoelectric converting elements.

Line 65, "the FIG. 4, in" should read --FIG. 4, in the--.

COLUMN 2

Line 66, "plurality" should read --a plurality--.

COLUMN 3

Line 1, "miting" should read --mitting--.
Line 9, "vicinity" should read --vicinity of--.
Line 57, "matellic" should read --metallic--.
Line 68, "simultaneous" should read --simultaneously--.

COLUMN 4

Line 9, "Thus, it is more advantageous." should be deleted.
Line 15, "are" should read --they are--.

Signed and Sealed this

Twenty-second Day of February, 1994

Attest:

BRUCE LEHMAN

*Attesting Officer*     *Commissioner of Patents and Trademarks*